US008653505B2

(12) United States Patent
Cuozzo et al.

(10) Patent No.: US 8,653,505 B2
(45) Date of Patent: Feb. 18, 2014

(54) ORGANIC THIN FILM TRANSISTOR AND PROCESS FOR MANUFACTURING SAME

(75) Inventors: Roberta Cuozzo, Naples (IT); Anna Morra, Cercola (IT); Teresa Napolitano, Cimitile (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 217 days.

(21) Appl. No.: 12/478,475

(22) Filed: Jun. 4, 2009

(65) Prior Publication Data

US 2009/0236593 A1 Sep. 24, 2009

Related U.S. Application Data

(62) Division of application No. 11/538,390, filed on Oct. 3, 2006, now Pat. No. 7,598,116.

(30) Foreign Application Priority Data

Oct. 10, 2005 (IT) .............................. MI2005A1901

(51) Int. Cl.
*H01L 51/05* (2006.01)
(52) U.S. Cl.
USPC ......................................................... 257/40
(58) Field of Classification Search
USPC ............ 257/40, E51.001–E51.008, 288, 499; 438/99
See application file for complete search history.

(56) References Cited

U.S. PATENT DOCUMENTS

| | | | | |
|---|---|---|---|---|
| 6,087,196 A * | 7/2000 | Sturm et al. | | 438/29 |
| 6,326,640 B1 * | 12/2001 | Shi et al. | | 257/40 |
| 6,858,477 B2 * | 2/2005 | Deane et al. | | 438/149 |
| 6,867,081 B2 * | 3/2005 | Weng et al. | | 438/197 |
| 7,514,710 B2 * | 4/2009 | Vogel et al. | | 257/40 |
| 7,572,651 B2 * | 8/2009 | Sirringhaus et al. | | 438/21 |
| 2003/0160235 A1 * | 8/2003 | Hirai | | 257/40 |
| 2005/0029514 A1 * | 2/2005 | Moriya | | 257/40 |
| 2005/0211972 A1 * | 9/2005 | Fix et al. | | 257/40 |
| 2005/0287697 A1 * | 12/2005 | Unno et al. | | 438/99 |
| 2006/0148167 A1 | 7/2006 | Brown et al. | | |
| 2006/0226420 A1 * | 10/2006 | Nanai et al. | | 257/40 |
| 2007/0012950 A1 * | 1/2007 | Cain et al. | | 257/194 |

FOREIGN PATENT DOCUMENTS

| | | | |
|---|---|---|---|
| JP | 61256671 A | * | 11/1986 |
| WO | WO 2005022664 A2 | * | 3/2005 |
| WO | WO 2005036652 A1 | * | 4/2005 |

\* cited by examiner

*Primary Examiner* — Michele Fan
(74) *Attorney, Agent, or Firm* — Hogan Lovells US LLP

(57) ABSTRACT

An organic thin film transistor includes a dielectric layer and an active layer overlapping the dielectric layer, a source contact and a drain contact arranged on a surface of the active layer opposite the dielectric layer and mutually separated by an intermediate region, the source contact and drain contact having first and second inner walls, respectively, facing the intermediate region, and a gate contact arranged on a portion of another surface of the dielectric layer opposite the active layer and having first and second side walls aligned with the first and second inner walls, respectively.

10 Claims, 12 Drawing Sheets

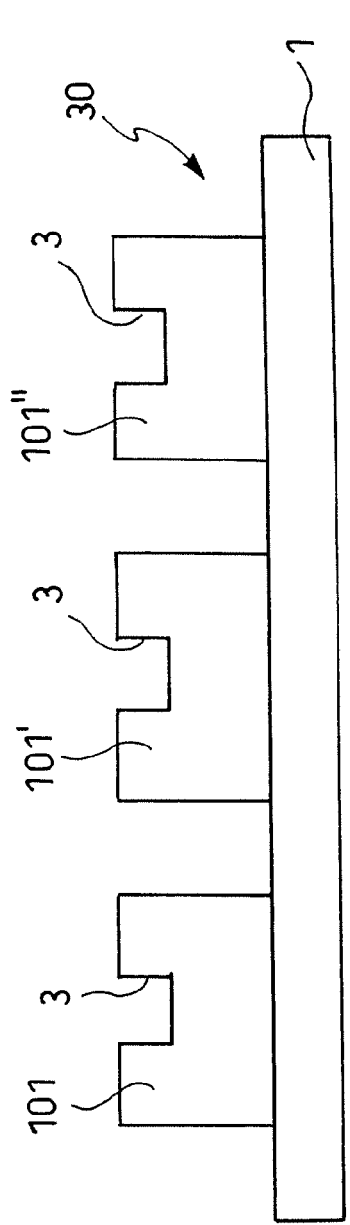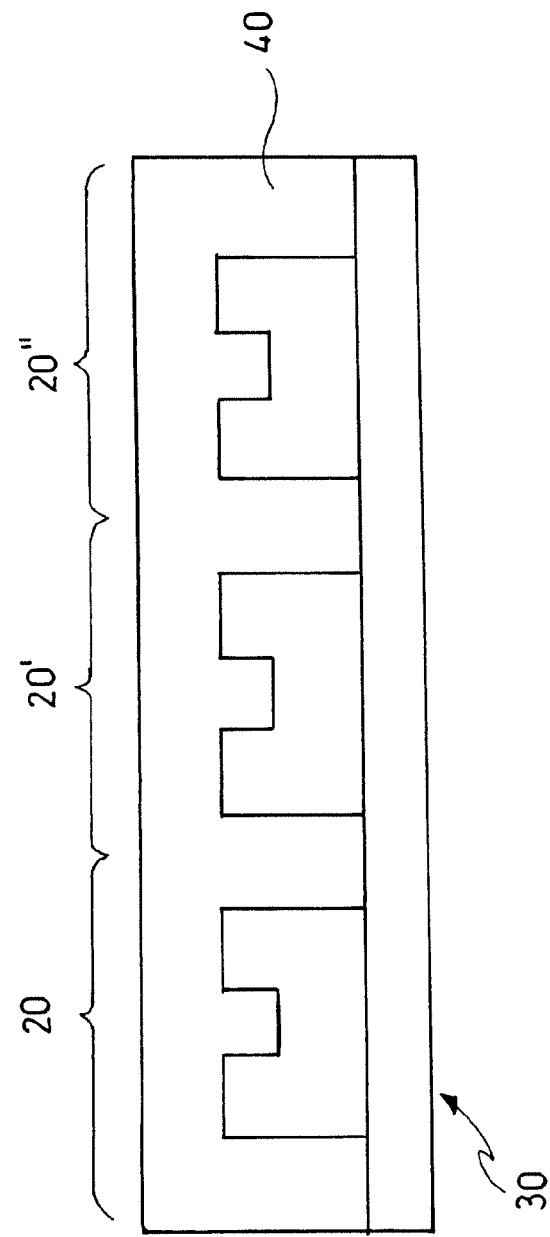
FIG.15
FIG.16

ORGANIC THIN FILM TRANSISTOR AND PROCESS FOR MANUFACTURING SAME

RELATED APPLICATION

The present application is a divisional filing of, and claims priority to U.S. patent application Ser. No. 11/538,390 filed Oct. 3, 2006, which claim priority of Italian Patent Application No. MI2005A001901 filed Oct. 10, 2005, both of which applications are incorporated herein in their entireties by this reference.

FIELD OF THE INVENTION

The present invention relates to organic thin film transistors (OTFT).

BACKGROUND OF THE INVENTION

OTFT transistors are electronic devices in which the semiconductor layer is made of organic material.

The research in this field has led to the development of OTFT transistors in which, in addition to the semiconductor layer, the dielectric layer and the source, drain, and gate contacts are also made of organic materials, respectively.

OTFT transistors are a valuable alternative to traditional inorganic thin film transistors.

OTFT transistors, similarly to traditional Metal Oxide Semiconductor Field Effect Transistor transistors (MOSFET) have a semiconductor layer (in which the conductive channel is formed) that is deposited on a dielectric layer. Most of OTFT transistors presently known in the literature are so-called p-channel devices.

OTFT transistors are usually classified according to two major categories based on the position of the source and drain contacts relative to the semiconductor layer: top contact configuration, and bottom contact configuration.

In the top contact configuration, the source and drain contacts are placed in contact with the upper surface of the semiconductor layer and extend outside the latter.

In the bottom contact configuration, the source and drain contacts are placed in contact with the lower surface of the semiconductor layer and extend within the latter. In both configurations, the gate contact is deposited on the substrate, as already traditionally occurs with devices of this type.

In the fabrication of OTFT transistors in the bottom contact configuration, the organic semiconductor layer has been noted to be of worse quality, and accordingly worse performance, than the top contact configuration. This implies that, at present, top-performing OTFT transistors are manufactured in a top contact configuration.

OTFT transistors are currently competitive in those applications that require the coverage of large areas, flexible structures, forming process at room temperature, low-cost manufacturing technology. In fact, the organic materials allow, for example, employing techniques for manufacturing large-area devices and are compatible with flexible substrates, i.e. made of a material other than conventional silicon or glass (rigid substrates), i.e. organic material (such as PEN film, polyethylene naphtalate) or even paper sheets.

The techniques used for the deposition of organic material mainly fall in two categories: solution casting and high-vacuum thermal deposition. Depositions techniques such as solution casting, dip-coating, spin-coating and printing belong to the first category.

An important aspect in the manufacture of OTFT transistors is the geometry definition in the semiconductor layer. In fact, the geometry definition in the organic material layer is quite complicated, as subsequent treatments on the organic material will cause a degradation of the properties thereof. For example, for several applications, a deposition technique by means of an auxiliary mask (known as the "shadow mask") is either employed, or the organic material is mechanically removed from around the geometry to be defined. Both cases have drawbacks related to the fact that high area densities cannot be obtained, as well as other problems due to the use of masks, which require to be cleaned after each use, and in case of high-resolution type, result to be thin and easily breakable.

Alternatively to the photolithographic techniques (or however those requiring a mask), techniques have been recently developed, which combine the deposition and definition of the geometries of the semiconductor layer in an individual step (for example, the technique of solution casting by printing).

Furthermore, among the low-cost techniques, those belonging to the family of non-photolithographic techniques known as the soft-lithography are widely used. It comprises a number of techniques used for manufacturing, for example, high-quality microstructures and nanostructures using masks, molds and elastomeric stamps to define geometries in a determined layer and transfer them to the device substrate. The primary soft-lithographic techniques known in the literature are: Microcontact printing (pMC), Micromolding in capillaries (MIMIC), Replica molding (REM), Microtransfer molding (μTM) and Solvent-assisted micromolding (SAMIM).

However, the manufacturing techniques known as yet, though having appealing aspects, still do not allow OTFT transistors to be fabricated such as to conjugate the requirement of low manufacturing costs with a satisfactory electric performances of the resulting OTFT transistors.

SUMMARY OF THE INVENTION

The object of the present invention is to provide a process for fabricating a OTFT transistor which is capable of overcoming the above restriction, particularly by reducing the manufacturing costs while allowing providing devices with electric performances suitable for the applications to which they are intended. In addition, according to an example, the object of the present invention is to provide a process based on low-cost techniques, which allows applying the geometry definition process to every layer in an OTFT transistor, which results to be profitable also for the simultaneous manufacture of several transistors.

This object is achieved by a process for manufacturing an organic thin film transistor which includes the steps of arranging a shaping element having a first profile defining a slot, forming a mold suitable to define a cavity with the shaping element, depositing source and drain layers, an active material layer and a dielectric layer within the cavity, depositing a gate layer in the slot of the shaping element, and transferring the gate layer in contact with the dielectric layer by means of the shaping element.

Preferably, the first profile defines first and second side relieves separated from the slot, which has a respective depth relative to the side relieves. The mold preferably includes a second profile complementary to the first profile so as to define the cavity, which includes a main seat opened on first and second seats corresponding to the first and second side relieves, respectively, and separated by a partition wall complementary to the slot and having a height equal to the depth.

The forming of the source and drain layer preferably takes place within the first and second seats of the cavity, respectively, until a thickness equal to the height of the partition wall is achieved, with the source contact, drain contact and partition wall defining a plane region thereon. Also, deposition of the active layer may be within the cavity in contact with the plane region, with the active layer having a first surface in contact with the plane region. The dielectric layer is also deposited within the cavity in contact with the active layer and having a second surface opposite the active layer.

Preferably, the gate contact is formed within the slot of the first mold until a gate thickness is equal to the depth of the slot. Also, the shaping element is partially within the slot until the gate contact is caused to abut against a first portion of the second surface of the dielectric layer. The shaping element has outer walls resulting adjacent to inner walls of the cavity aligning the gate contact with the partition wall.

The method preferably includes removing the shaping element from the mold cavity, the gate contact and inner walls of the cavity defining first and second openings.

The step of forming first and second regions of polymeric substrate within the first and second openings, respectively until a thickness is achieved equal to that of the gate contact.

Preferably, the shaping element is made of silicon dioxide, the mold is made of polydimethylsiloxane (PDMS), polymethylmethacrylate (PMMA) or polydimethylsiloxane-co-polymethylmethacrylate (PDMS-co-PMMA). The source and drain contacts preferably comprise polyaniline (PANI), poly-3-4-ethylenedioxythiophene (PEDOT) or carbon particles. The dielectric layer is preferably poly(vinylphenol) (PVP). The preferred active material layer is poly(thienylene vinylene) (PTV). The gate contact is provided according to one of the following materials: PANI; PEDOT; or carbon particles. The polymeric substrate is preferably polyethylene terephtalate (PET) or polycarbonate.

In one embodiment, the first mold is provided by means of a photolithographic process using first and second masks.

Also, the mold may be formed with a spin-coating technique. The mold may have elastomeric properties.

In one embodiment, formation of the source and drain contacts, active material layer and dielectric layer is carried out using solution casting techniques.

The step of transferring the gate contact on the surface may involve spreading an adhesion promoter material on the surface.

Preferably, the depth of the slot is from 0.2 to 20 μm, the gate contact has a length from 0.5 to 200 μm, and the dielectric layer has a thickness from 250 to 500 nm.

In preferred embodiments, formation of the source and drain layers involves solutions selected from the group including PANI in m-cresol, PEDOT in water and carbon particles in ethanol. The formation of the dielectric layer may involve a solution of poly(vinylphenol) in isopropanol. Also, a solution of a precursor of poly(thienylene vinylene) in dimethyl-formamide is used for the formation of the active layer.

In an embodiment of the invention, a further organic thin film transistor is formed by preparing a first matrix structure defining the shaping element and a further shaping element are arranged on a common support and spaced apart from each other, the further shaping element defining a further slot, forming, by means of said first matrix structure, a second matrix structure defining the mold and a further mold defining a further cavity, forming further source and drain layers, a further active material layer, and a further dielectric layer within the second cavity, depositing a further gate layer within the further slot, and transferring, by means of the first matrix structure, the gate layer and the further gate layer in contact with the dielectric layer and with the further dielectric layer, respectively. Additional steps may include providing an alignment structure mechanically coupled to the second matrix structure so as to allow the alignment of said first matrix structure with the second matrix structure. The process may also further include the steps of removing the first matrix structure and forming a common polymeric material substrate interposed between the gate contact and the further gate contact, the polymeric material substrate electrically insulating the gate contact and the further gate contact.

An object of the present invention is also an organic thin film transistor which includes a dielectric layer and an active layer overlapping the dielectric layer, a source contact and a drain contact arranged on a first surface of the active layer opposite the dielectric layer and mutually separated by an intermediate region, the source contact and drain contact having first and second inner walls, respectively, facing the intermediate region, and a gate contact arranged on a first portion of a second surface of the dielectric layer opposite the active layer and comprising first and second side walls aligned with the first and second inner walls, respectively.

Preferably, the transistor further includes a substrate adjacent to the gate contact, arranged on remaining portions of the second surface, and having a thickness equal to a respective thickness of the gate contact. The substrate may be made of a flexible material and serves as a support. Preferred substrates are polyethylene terephtalate, PET or polycarbonate.

In a preferred embodiment, source and drain contacts comprise polyaniline, PANI, poly-3-4-ethylenedioxythiophene, PEDOT, or carbon particles. A preferred dielectric layer is poly(vinylphenol), PVP. A preferred active material layer is poly(thienylene vinylene), PTV.

Most preferably, the dielectric layer, active layer, source contact, drain contact and gate contact are all made of organic material. It is also preferred that the transistor is in a top contact configuration.

BRIEF DESCRIPTION OF THE DRAWINGS

The invention will be better understood from the following detailed description of an embodiment thereof, which is given by way of non-limiting example with reference to the annexed drawing, in which:

FIGS. 15-22 are longitudinal sectional views of intermediate steps of a manufacturing process according to an exemplary variant of the invention.

DETAILED DESCRIPTION

Figure 1:
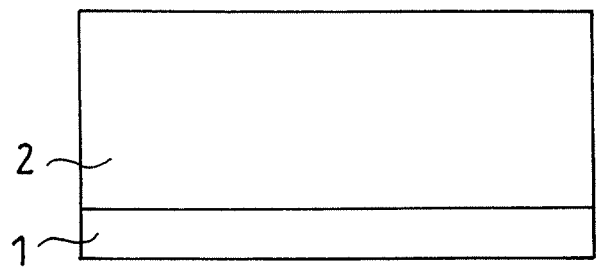
FIGS. 1 and 2 are longitudinal sectional views of intermediate steps of a manufacturing process to be used in the manufacturing process according to an example of the invention.

An exemplary process for manufacturing an organic thin film transistor (OTFT) is shown in the drawings, generally designated with numeral 100.

The first step provides the construction of a shaping element 101, referred to as the master herein below.

With reference to FIG. 1, a layer of dielectric material 2, preferably silicon dioxide, is deposited on a substrate, for example of silicon 1, in which any contaminant (such as dust, grease, fabric fibers, etc) has been previously removed. The formation of the silicon dioxide layer 2 can be obtained using one of the conventional techniques known to those skilled in the art, such as the dry/wet oxidation deposition techniques at high temperature (preferably 800-1200° C.), the Chemical Vapor Deposition technique (CVD) or the Plasma Enhanced Chemical Vapor Deposition (PECVD).

Figure 2:
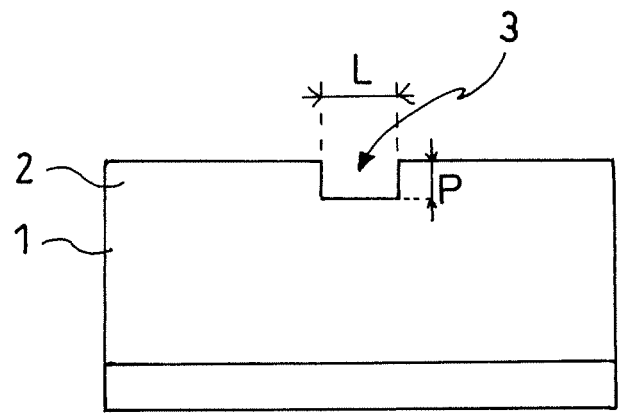

On the structure shown in FIG. 1, a conventional photolithographic process is carried out for the definition of a slot 3 that is arranged, as in the example shown in FIG. 2, in the centre of the structure.

Figure 3:
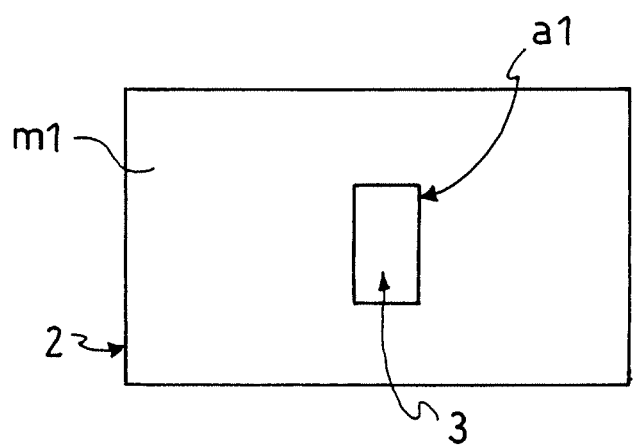
FIGS. 3 and 4 are plan views of selective masks to be used in the manufacturing process in FIGS. 1 and 2.

With reference to FIG. 3, the slot 3 is formed by defining a first mask m1 suitable to leave an area a1 exposed (e.g. a rectangular area), having a first pair of short sides and a first pair of long sides. The first pair of short sides has a length equal to a first dimension L. Subsequently, the silicon dioxide layer 2 is selectively attached thereto in order to remove the portion not protected by the mask m1 and a preset depth p is achieved by the etching step. Said depth p can be set, for example, in a range of 0.2 to 20 μm.

Figure 4:
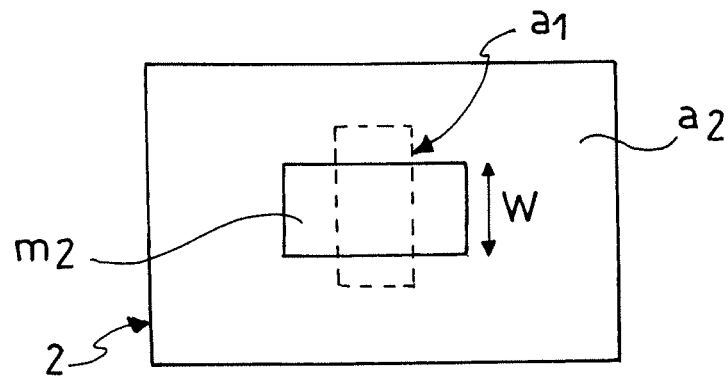

With reference to FIG. 4, a second conventional photolithography process is used, which provides the definition of a second mask m2. The second mask m2 has, for example, a rectangular shape being defined by a second pair of short sides and a second pair of long sides. The second mask m2 is defined such that the second pair of long sides has a parallel direction to the first pair of short sides of the area a1 and such that the second pair of short sides has a length equal to a second dimension W. The second mask m2 is suitable to cross-intersect the area a1. In FIG. 4, the area a1 is represented with a dotted line crossing the second mask m2. A selective etching step is followed, such as of a dry or wet type, to remove a portion a2 of the silicon dioxide layer 2 that is not protected by the mask m2. The etching is carried out until the silicon substrate is reached in depth.

The first dimension L and the second dimension W correspond to, as will be understood from the description below, the length and width of the active area of the transistor 100 (gate contact G), respectively. The first dimension L of from 0.5 to 200 μm, the second dimension W can be extended to ten times the first dimension L. The depth p, as will be described below, defines the thickness of the source S and drain D contacts of the transistor 100.

The use of the coupled silicon-silicon dioxide materials results to be particularly advantageous, in that different selective etchings are available, such as by means of hydrofluoric acid, which are capable of removing the silicon dioxide without damaging the underlying silicon substrate.

Figure 5:
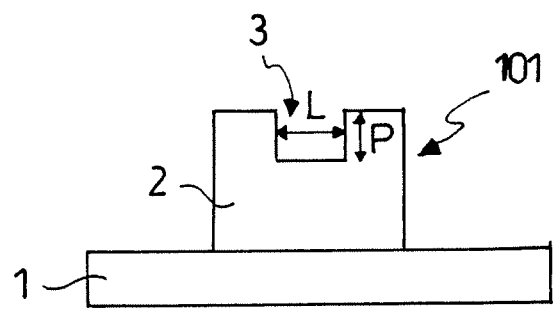
FIG. 5 is a longitudinal sectional view of a shaping element or master manufactured in the intermediate steps in FIGS. 1 and 2 and with the selective masks in FIGS. 3 and 4.
Figure 6:
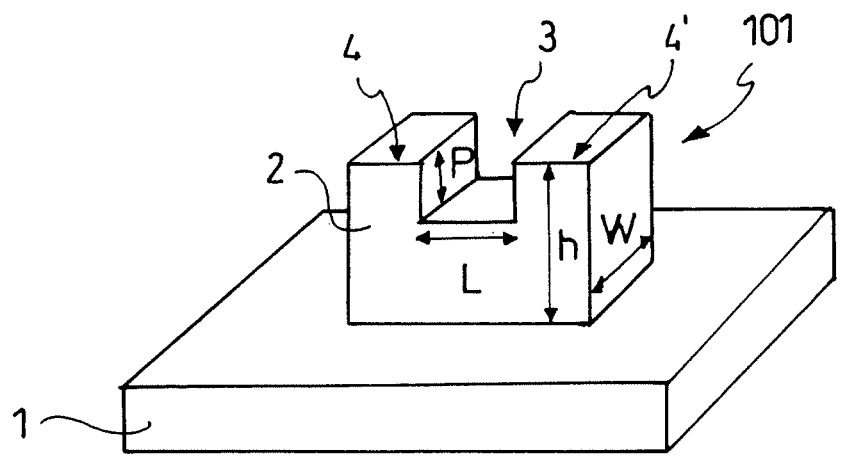
FIG. 6 is a perspective view of the master from FIG. 5.

The final result after this second photolithography process is the master 101, such as depicted in FIGS. 5 and 6. The master 101 has a width equal to the second dimension W, a preset length and height, the latter being designated with h, corresponding to the thickness of the silicon dioxide layer 2.

The thickness achieved with the silicon dioxide layer can be, for example, equal to at least 0.6 μm. The master 101 thus has a first profile defining first 4 and second 4' side relieves that are separated by the slot 3, the latter having width equal to the first dimension L, length equal to the second dimension W and depth p.

Figure 7:
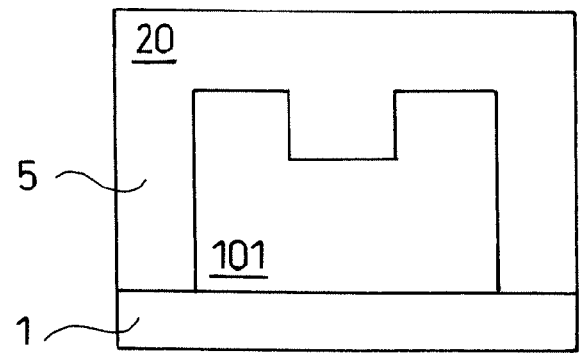
FIG. 7 is a longitudinal sectional view of a step of a process for forming a mold to be used in the manufacturing process according to the invention.

With reference to FIG. 7, a mold 20 is fabricated on the master 101. The manufacturing of said mold provides a step of spin-coating deposition of a layer of suitable material, such as preferably a liquid polydimethylsiloxane prepolymer (PDMS). Alternatively, a solution of polymethylmethacrylate (PMMA) or a solution of polymethylsiloxane-co-polymethylmethacrylate (PDMS-co-PMMA) can be deposited. By the spin-coating techniques, which is known per se, a suitable amount of liquid PDMS prepolymer is deposited on the master 101, which, in turn, has been placed on a dish of a suitable spin-coater, which causes the master to rotate until the PDMS prepolymer is evenly distributed thereon.

A curing is then carried out at a preset temperature and time (e.g., 65° C. for one hour), in order to obtain the evaporation of the solvent and the polymerization of the PDMS prepolymer thus obtaining the mold 20. After the treatment, the mold 20 has solidity characteristics and, at the same time, in consideration of the materials used in the preparation of the same, it also has elastomeric properties. The thickness of the mold can be controlled based on several variables of the preparation process (among the major ones there are: speed and rotation time of the spin-coater, viscosity of the PDMS prepolymer solution).

Figure 8:
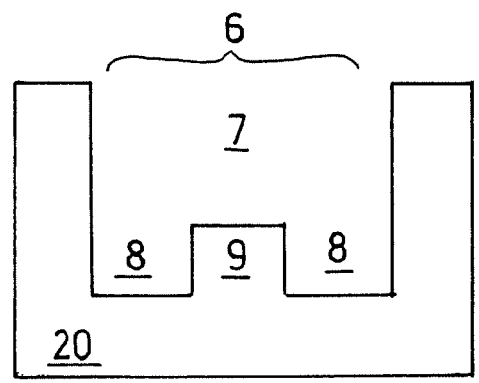
FIG. 8 is a longitudinal sectional view of the mold obtained with the process step as shown in FIG. 7.

At this stage, the master 101 and the mold 20 are separated from each other and the mold is turned upside down and placed as illustrated in FIG. 8. The mold 20 has a second profile, complementary to the first profile of the master 101, which is suitable to define a cavity 6 comprising a main seat 7 that opens on first 8 and second 8' seats corresponding to said first 4 and second 4' relieves of the master, respectively, which are separated by an intermediate region represented by a partition wall 9 complementary to the slot 3.

Figure 9:
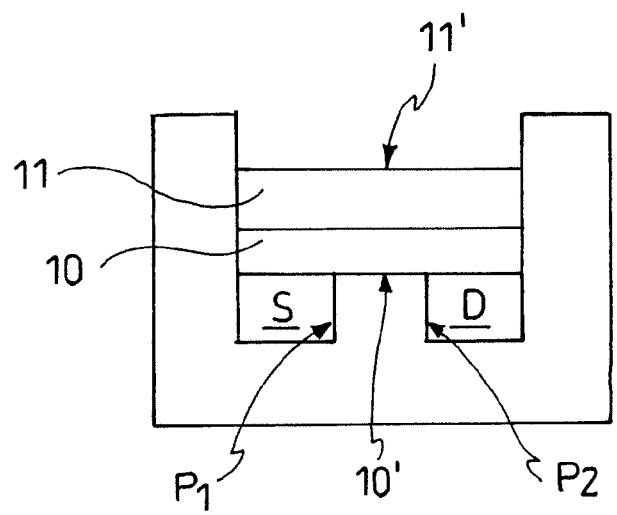
FIGS. 9-13 are longitudinal sectional views of intermediate steps of a manufacturing process according to the example of the invention.

Furthermore, a step of forming the source S and drain D contacts of the transistor 100 is then carried out. With reference to FIG. 9, a solution of an organic conductive material in a suitable solvent is deposited within the first 8 and second 8' seats of the cavity 6 until the height of the partition wall 9 (equal to depth p) is reached. The source contact S, the drain contact D and the partition wall 9, thus placed side by side, define a plane region thereon. The drain D and source S contacts are made of an electrically conductive organic material, such as polyaniline, PANI.

The deposition technique used is solution casting. In the solution casting, a device (such as a pipette) is used for delivering the solution on the target surface. As the solution, a polyaniline PANI solution can be used with m-cresol solvent or alternatively a poly-3-4-ethylenedioxythiophene-based (PEDOT) solution in water or carbon particles in ethanol. After the solvent has evaporated, an even solidification is obtained within the first 8 and second 8' seats. The source S and drain D contacts comprise first P1 and second P2 inner walls that are in contact with the side walls of the partition wall 9 defining the intermediate region. Advantageously, each of the solvents mentioned above and used for the formation of the source S and drain D contacts is such that the mold 20 is not damaged, i.e. PDMS is not etched.

A step is carried out in which an active layer 10 of organic material (typically, polymer semiconductor) is formed, which has a first surface 10' in contact with the plane region defined by the source contact S, partition wall 9 and drain contact D. The active layer 10 is preferably made of poly(thienylene vinylene), PTV. The formation of the active layer 10 can be provided by deposition and subsequent solvent evaporation, which can be carried out by techniques similar to those described for the formation of the source and drain contacts.

For example, a solution of a PTV precursor in dimethylformamide is deposited, and then a conversion step occurs at a preset temperature ranging between 100 and 200° C. under an inert nitrogen atmosphere. Advantageously, the solvent is selected such that the mold 20 and the (already formed) source S and drain D contacts are not damaged. It should be further considered that the temperature range selected for solvent evaporation and PTV precursor polymerization can be also tolerated by the mold 20. An exemplary thickness that can be achieved in the semiconductor material layer 10 is 50 nm.

A step is then carried out, which is similar to the preceding one in terms of deposition and evaporation techniques, for forming a dielectric layer 11 of organic material on the active layer 10. The solution used can be, for example, a PVP solution (dielectric material forming the layer 11) in isopropanol. The thickness that can be reached with the dielectric layer 11 of from 250 to 500 nm. The solvent used is such that the mold 20 and active layer 10 are not damaged. The dielectric layer 11 has a second surface 11' opposite the active layer 10.

Figure 10:
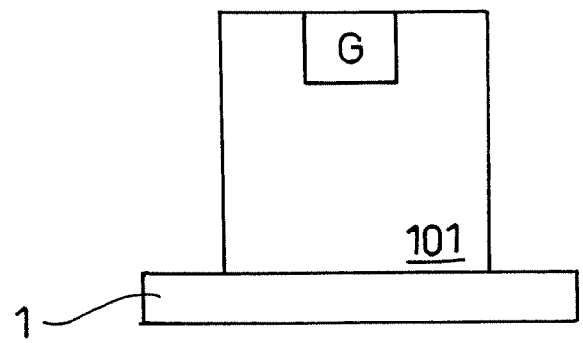
Figure 11:
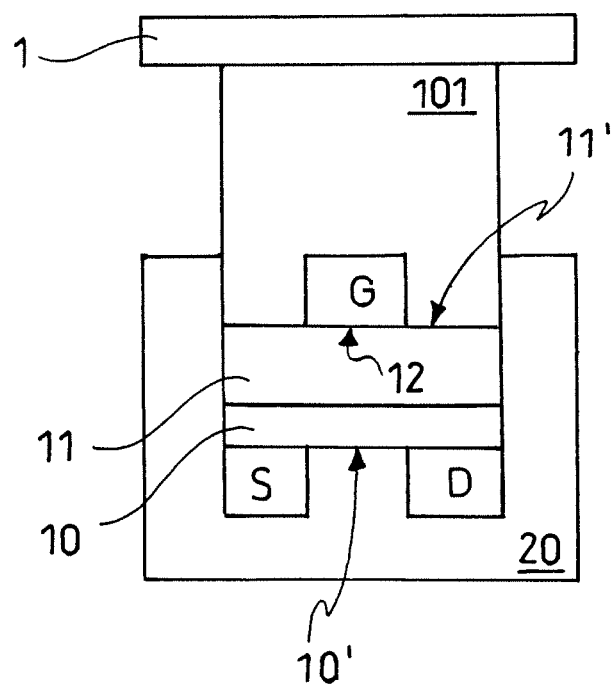
Figure 12:
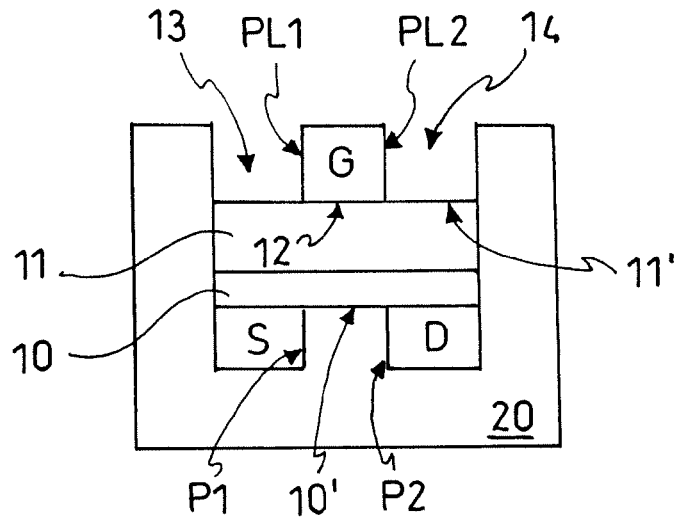

With reference to FIG. 10-12 a step of forming a gate contact C of the transistor 100 is then carried out. As shown in FIG. 10, the master 101 is used again (the same used for forming the mold 20) and a solution of organic conductive material (for example, PANI as mentioned above) is deposited within the slot 3, similarly as in the example described for the source S and drain D contacts until the slot 3 is filled therewith. It should be observed that, for the formation of the gate contact G, the master 101 serves as an actual mold.

The organic conductive material forms the gate contact G and has a thickness equal to the depth p. A PANI solution in m-cresol, or alternatively a PEDOT-based solution in water or a carbon-based solution in ethanol can be used for manufacturing this material. The technique used is, again, the deposition by means of solution casting. Then, a controlled evaporation of the solvent is carried out such that the organic material within the slot 3 has adhesive properties. At this stage, as shown in FIG. 11, the master 101 with the slot 3 filled with organic material is turned upside down and fittingly inserted within the cavity 6 of the mold 20 such as to cause the gate contact G to abut against a first portion 12 of the second surface 11' of the dielectric layer 11. Advantageously, the gate contact has such adhesive properties as to ensure a permanent adherence of the gate contact G to the dielectric layer. In some cases, prior to positioning the master 101, the adherence can be facilitated by applying an organic adhesion promoter material (not shown in the figures) on the second surface 11' of the dielectric layer 11. An evaporation step of the gate contact G solvent and a removal step of the master 101 are then carried out. As illustrated in FIG. 12, the gate contact G results to be in contact with the first portion 12 of the second surface 11' and comprises a first PL1 and a second PL2 side walls which are aligned with the first P1 and second P2 inner walls, respectively, of the source S and drain D contacts, respectively. The gate contact has a height equal to the depth p. First 13 and second 14 openings are provided within the cavity 6, on the left and on the right of the gate contact.

Figure 13:
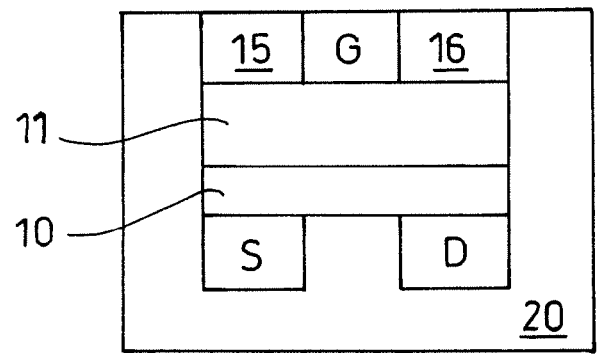

With reference to FIG. 13, a step of forming a substrate in polymeric material (substrate regions 15 and 16) within the first opening 13 and second opening 14 is then carried out. The conventional technique of solution deposition by means of solution casting, such as PET (forming the substrate) in m-cresol (solvent) is used for the formation the substrate 15-16. In this case, the substrate is of a plastic type. Alternatively, in addition to the deposition techniques discussed above, other polymeric materials can be also deposited, which are normally used as the substrate, such as for example a polycarbonate solution in THF (tetrahydrofuran). After the solvent has evaporated, the first 15 and second 16 polymeric substrate regions are obtained within the first 13 and second 14 openings, respectively, each having a thickness equal to that of the gate contact G (depth p).

Figure 14:
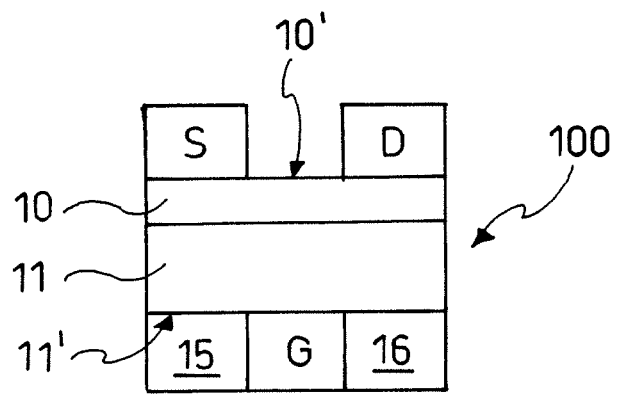
FIG. 14 is a longitudinal sectional view of an organic thin film transistor obtained by the manufacturing process according to the invention.

At this stage, the structure in FIG. 13 is turned upside down and the mold 20 is removed. The properties of the selected organic materials for the formation of the source S and drain D contacts, dielectric layer 10, active layer 11, gate contact G and first 15 and second 16 substrate portions, respectively, are such that they do not adhere to the mold 20. There results a transistor 100 as that shown in FIG. 14. It should be noted that the transistor 100 has the source S and drain D contacts in contact with and above the active layer 10; this type of configuration is known to those skilled in the art as the top contact configuration.

The process described can be further used for the parallel manufacturing of a plurality of transistors distributed on a common panel, which is well known to those skilled in the art as the "backplane", such as to form a two-dimensional matrix.

By way of example, a process is described for manufacturing a backplane comprising three transistors place side by side to each other.

On a common substrate 1, by means of conventional photolithographic techniques, a first matrix structure 30 (i.e. a further master) is fabricated, which comprises three structural blocks 101, 101', and 101'' that are suitably spaced from each other, each of which has a similar profile and function as the master 101 described above (FIG. 15), for example.

Figure 17:
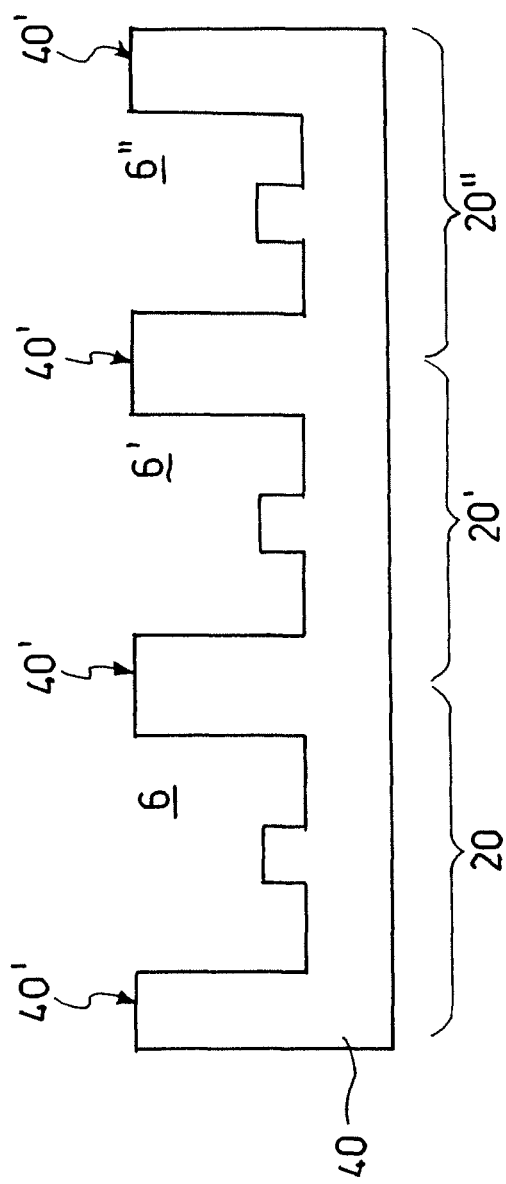
Figure 18:
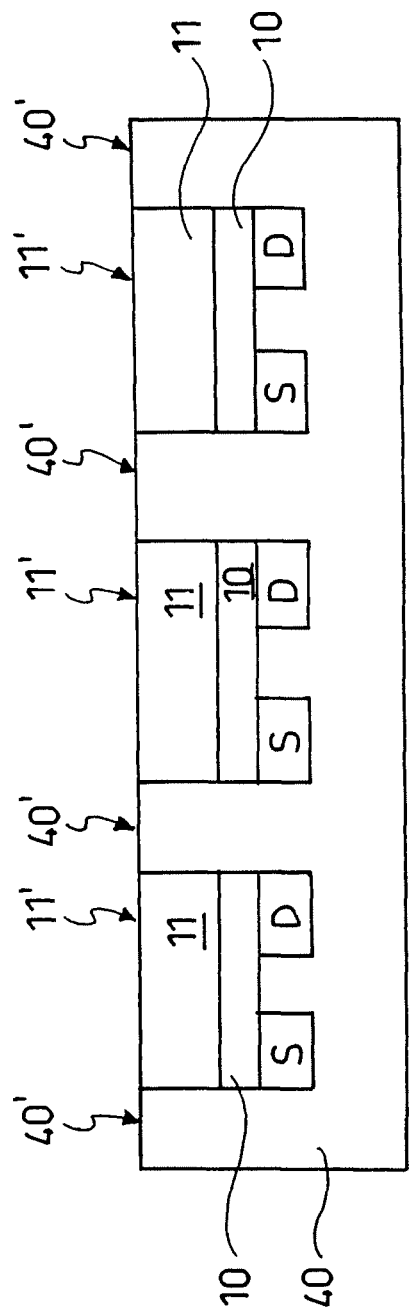

Thereafter, by means of deposition of suitable material (such as the above PDMS) on the first matrix structure 30 (FIG. 16), a second matrix structure or multicavity mold 40 is obtained which includes three cavities 6, 6' and 6'' similar to the cavity 6 of the mold 20 and functionally associable with corresponding molds 20, 20' and 20'' (FIG. 17). The multicavity mold 40 has an overall profile complementary to the first matrix structure 30. The cavities 6, 6' and 6'' are defined by side walls having upper surface designated with 40'. The deposition of the layers of organic material is then carried out for manufacturing the OTFT transistors. The source S and drain D contacts, dielectric layer 10 and active layer 11 (FIG. 18) are then formed in each cavity 6, 6' and 6''. For clarity purposes, the numerals and alphanumeric references reported herein will be equal to those used in the description and figures concerning the exemplary process for manufacturing the individual transistor as described above.

Preferably, during the deposition step, the active layer 11 is deposited such that the thickness thereof is accurately controlled in order that the second surface 11' results to be aligned with the upper surface 40'.

Figure 19:
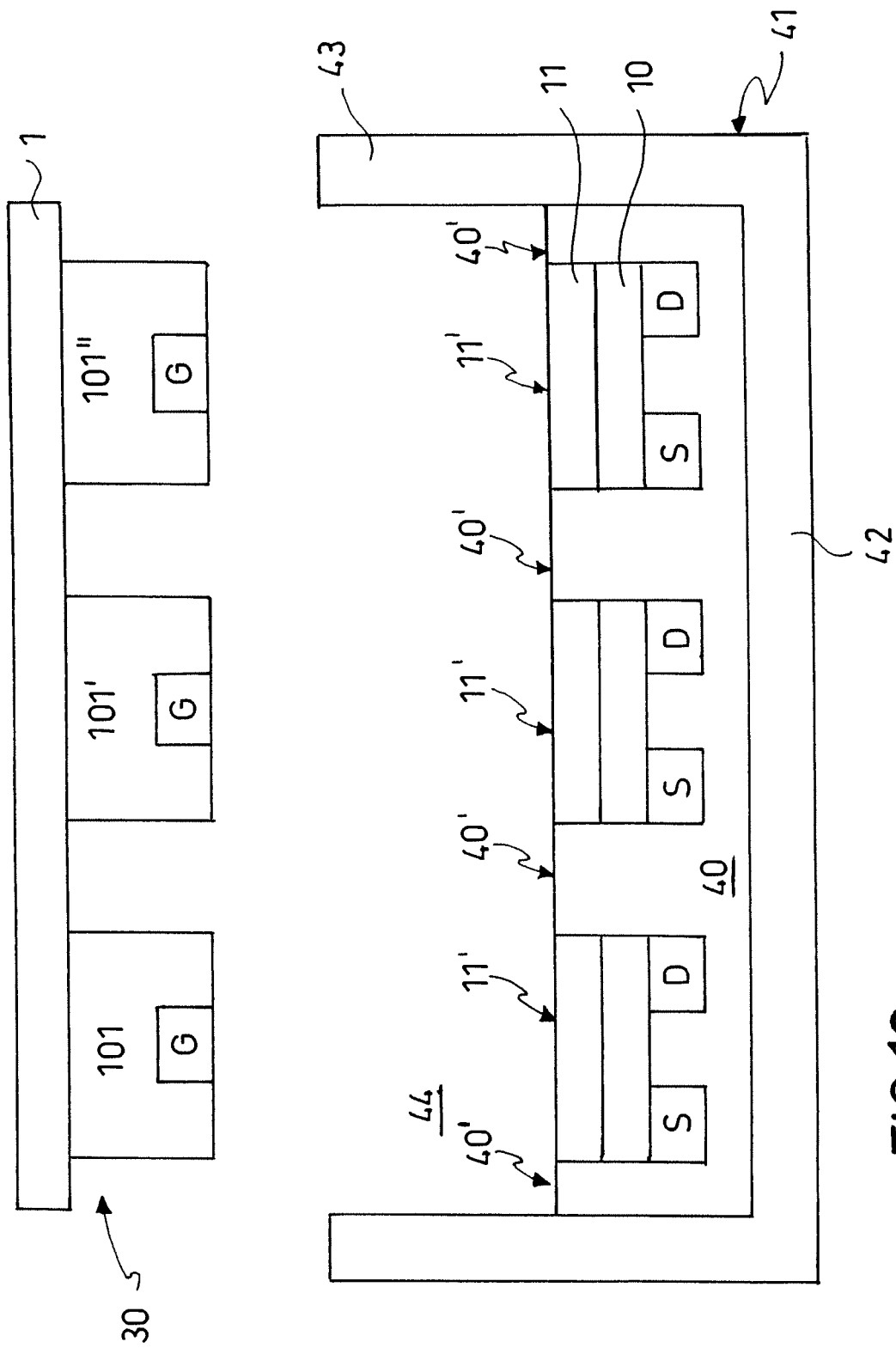

The respective gate contacts G are formed within the slots 3 of the first matrix structure 30. The first matrix structure 30 is then turned upside down, being thus arranged for coupling with an alignment structure 41 (FIG. 19). Particularly, said alignment structure comprises a bottom 42 and a side wall 43 that is vertical relative to the bottom, which define a housing 44 suitable to receive and hold the multicavity mold 40 in a fixed position. The depth of the housing 44 is preferably such as to be only partially occupied by the multicavity mold 40, in which the source S and drain D contacts, the active layer 10 and the dielectric layer 11 have been formed, respectively.

Figure 20:
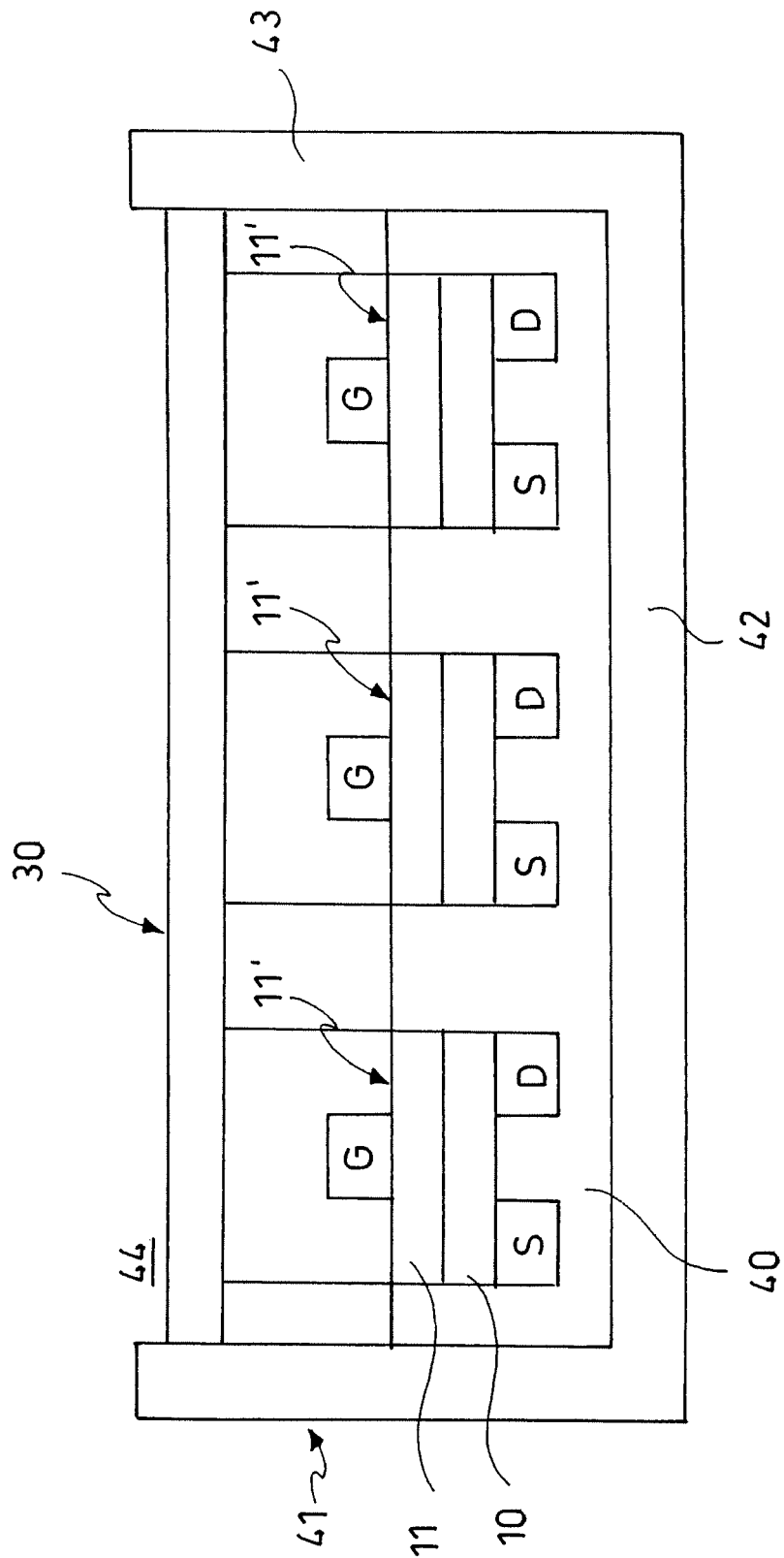

As shown in FIG. 20, the first matrix structure 30 is slidingly fitted within the housing 44 until each of the gate G is caused to abut against the respective second surface 11' of the active layer 10. The first matrix structure 30 is properly aligned relative to the multicavity mold 40, due to the side wall 43 of the alignment structure 41.

The alignment structure 41 allows obtaining, similarly to what has been obtained in the process for manufacturing an individual transistor, the alignment between the side wall of the gate contact G and the inner walls of the respective source S and drain D contacts.

Figure 21:
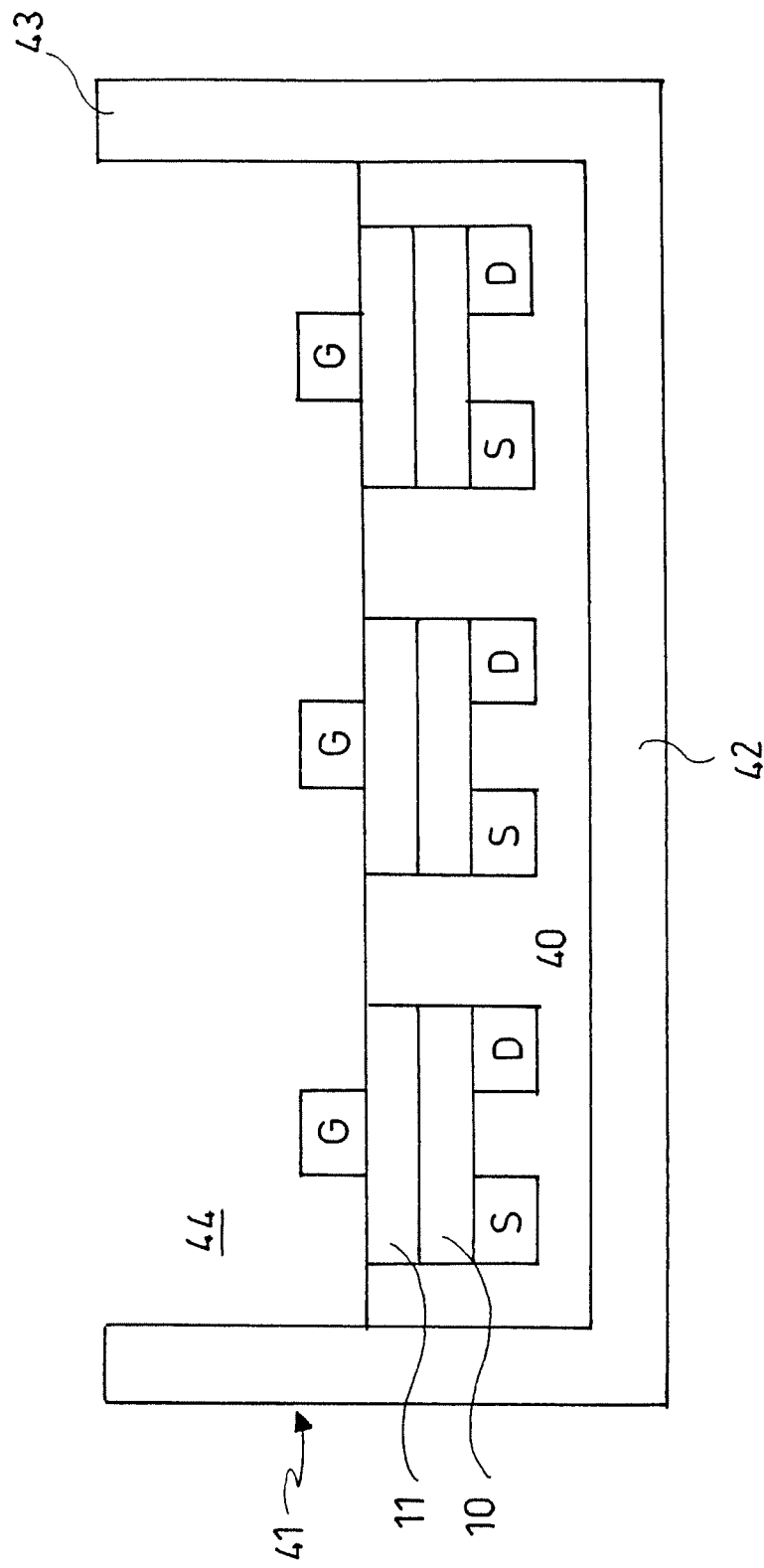
Figure 22:
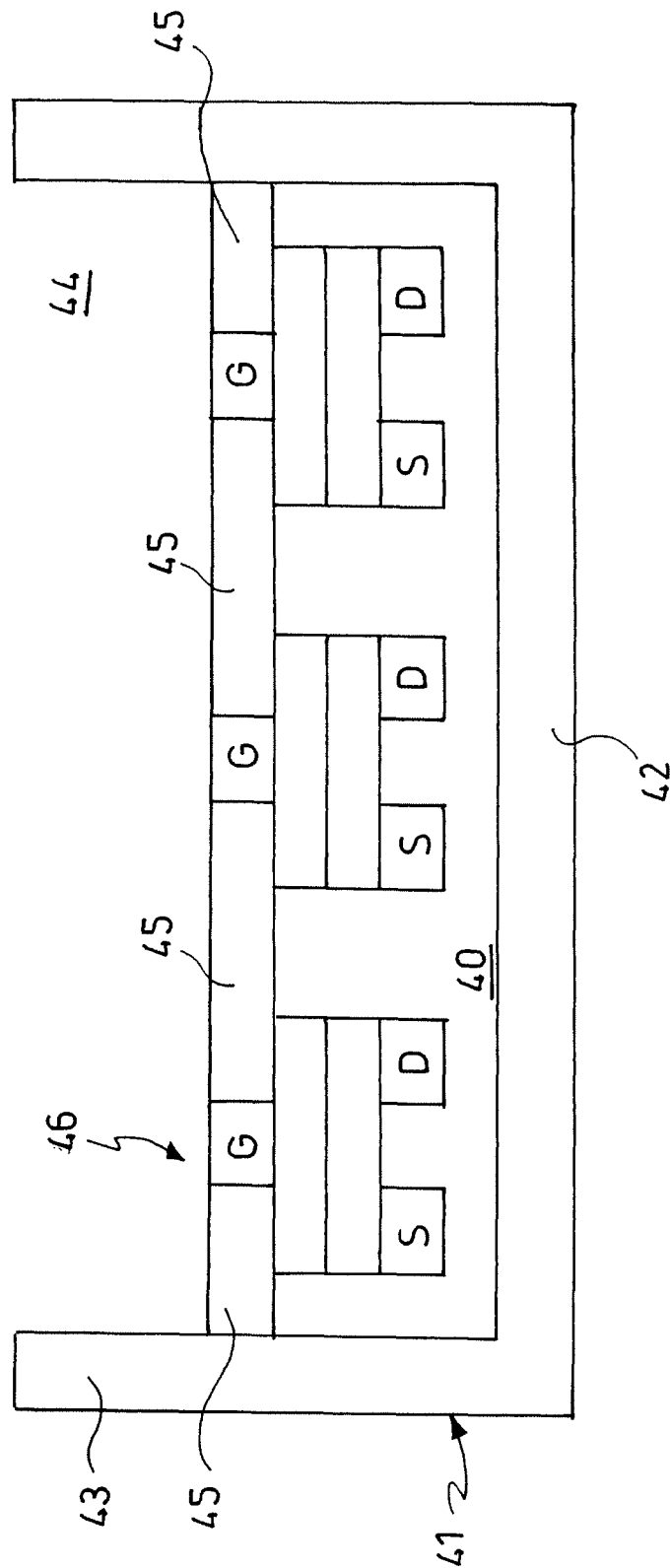

At this stage, the first matrix structure 30 is removed (FIG. 21), and the deposition is then carried out (with the same modalities as described above) of a substrate of polymeric organic material 45 with a controlled thickness such that it reaches the same thickness as the gate contacts G (FIG. 22). The polymeric material substrate, advantageously, electrically insulates from each other the gates of the transistors arranged on the same backplane. The organic material used can be obtained from, for example, a solution of polycarbonate in tetrahydrofuran, THF. In this step, the alignment structure 41 carries out a second function of defining the area in which the polymeric substrate has to be deposited. In the example reported herein, the area to be coated comprises both portions of the surfaces 11' and the upper surface 40'. At the end of this step, the alignment structure 41 comprises a backplane 46 within the housing 44.

Figure 23:
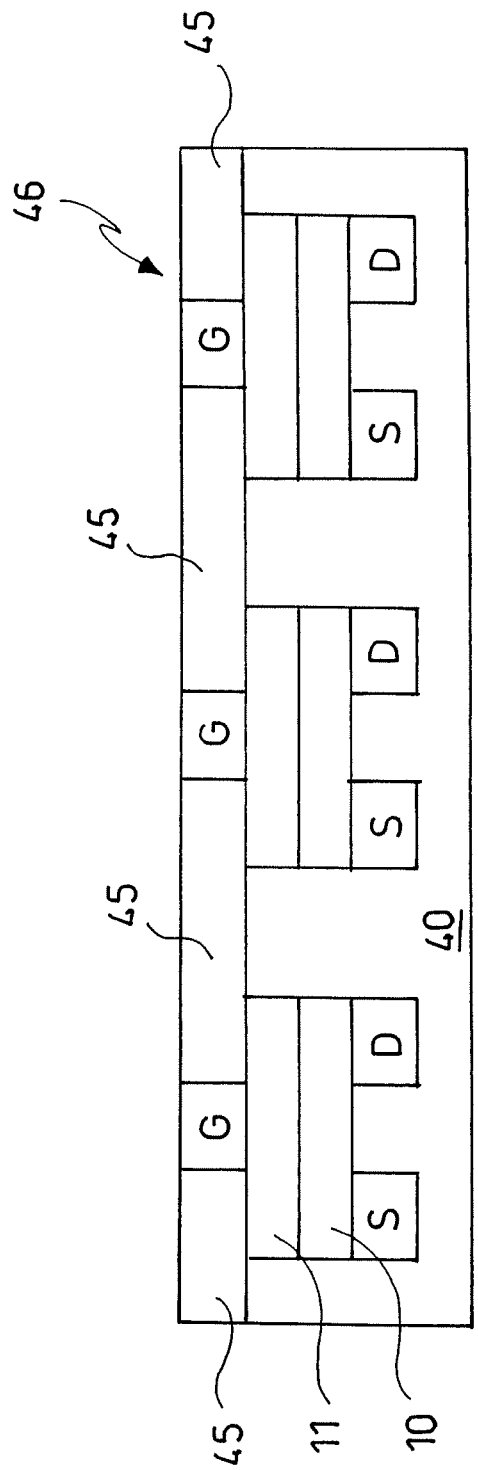
FIG. 23 shows a device comprising a plurality of organic thin film transistors obtained by the process steps shown in FIG. 15-22.

At this stage, the backplane 46 is removed from the alignment structure 41 (FIG. 23). Said backplane comprises three transistors that are placed side by side to each other having the gate contacts directly accessible from the outside and the source and drain contacts encapsulated by the multicavity mold 40. The polymeric material substrate also has the function of backplane support.

According to an embodiment of the invention, a series of transistors can be provided, by also removing the multicavity mold 40, which in addition to the gate contact also have source and drain contacts accessible from the outside.

By employing the process according to the invention, both in the case of manufacturing an individual transistor or a backplane with a plurality of transistors, the gate G, source S and drain D contacts are bounded by the slot 3 of the master and first 8 and second 8' seats of the cavity 6 defined by the mold 20, respectively. This aspect allows defining high-resolution transistors in full compliance with the design specifications in terms of dimensioning (L of the individual device). Particularly, the length L results to be controllable in that the source and drain contacts are formed within seats that are already shaped. In addition, the ranges of possible values that can be obtained for the parameters of the channel (L~0.5-200 µm; W~10*L µm) advantageously allow obtaining a high aspect ratio W/L, and being the drive voltage of the transistor (the drain current $I_D$) proportional to said ratio, the electric performance of the transistor can be increased.

It should be observed that, advantageously, the use of the mold 20 or multicavity mold 40 allows carrying out the definition of the layer geometries in an OTFT transistor in a particularly simple and effective manner, as the complicated definition steps or patterning of each layer forming the transistor are not required.

In addition, due to the fact that the side walls of the gate contact, and the inner walls of the source and drain contacts are aligned, respectively, gate contact portions facing source and drain contact portions are not provided. This advantageously reduces the undesired presence of losses due to parasite events which affect the operation of the device.

An advantage of the teachings of the present invention from the point of view of manufacturing costs is that the first mold or master 101 (or the first matrix structure 30) made in the initial steps of the process according to the invention can be employed several times for forming more molds, and for forming and depositing as many gate contacts, without any accuracy degradation resulting from repeated use being observed. Furthermore, the mold encapsulating the individual transistors, when removed, can be also reused for fabricating other transistors (at least up to 100 times).

The deposition techniques used in the examples of the process as described above, and which are selected based on the materials, prove to be cost-effective and thus the process results to be economical as compared with other conventional processes implemented for the manufacturing of OTFT transistors.

The typical applications of the manufacturing process according to the invention, and consequently, of a backplane fabricated therewith, are contemplated, for example, in the field of active matrix displays and identification systems (alternative to barcodes). It should be noted that the main requirement of said applications is the coverage of a large area at low costs, and in the case of identification systems, not of high electrical performance.

Furthermore, as the mold in which the individual OTFT transistors are formed is removed, the backplane advantageously results to be flexible, because the substrate separating the individual transistors from each other can be made of organic material (such as PET) and thus have a certain flexibility, thus allowing the backplane to be used on curved surfaces or adapted to non-necessarily plane profiles.

In extreme electronics, the OTFT transistors according to the invention may be expected to be used in the future as logic devices, for example, inverters, ring oscillators, differential amplifiers.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

We claim:

1. A device comprising a plurality of isolated organic thin film transistors, wherein each transistor comprises:
    a dielectric layer and an active layer overlapping said dielectric layer, said active layer having a first flat surface opposite said dielectric layer and a first further surface opposite to the first flat surface and faced to the dielectric layer, said dielectric layer having a second flat surface opposite the active layer and a second further surface opposite the second flat surface faced to the active layer, said active layer overlapping said dielectric layer so that the first further surface of the active layer is in direct contact with the second further surface of the dielectric layer;

a source contact and a drain contact arranged directly on the first flat surface of said active layer and mutually separated by an intermediate region, the source contact and drain contact having first and second inner walls, respectively, facing said intermediate region; and a gate contact, separate from the dielectric layer, arranged on a first portion of the second flat surface of the dielectric layer and comprising first and second side walls aligned with said first and second inner walls, respectively; and a multicavity mold for housing the plurality of organic thin film transistors.

2. The device according to claim 1, further comprising a substrate adjacent to the gate contact and arranged on remaining portions of said second flat surface, the substrate having a thickness equal to a respective thickness of the gate contact.

3. The device according to claim 2, wherein the substrate comprises flexible material and serves as a support.

4. The device according to claim 3, wherein the substrate comprises polyethylene terephtalate or polycarbonate.

5. The device according to claim 2, wherein the source and drain contacts are provided according to one of the following materials: polyaniline, poly-3-4-ethylenedioxythiophene, and carbon particles.

6. The device according to claim 2, wherein the dielectric layer comprises poly(vinylphenol).

7. The device according to claim 2, wherein the active layer comprises poly(thienylene vinylene).

8. The device according to claim 1, wherein the dielectric layer, active layer, source contact, drain contact and gate contact comprise organic material.

9. The device according to claim 1, wherein the source contact and the drain contact are underneath the active layer.

10. The device according to claim 1, wherein the gate contact is on top of the dielectric layer.

* * * * *